（12） United States Patent
Hamdan et al.

(10) Patent No.: US 11,264,976 B2
(45) Date of Patent: Mar. 1, 2022

(54) SYMMETRICALLY-INTERCONNECTED TUNABLE TIME DELAY CIRCUIT

(71) Applicant: QUALCOMM Incorporated, San Diego, CA (US)

(72) Inventors: Fadi Hamdan, Austin, TX (US); Keith Alan Bowman, Morrisville, NC (US); Nadeem Eleyan, Austin, TX (US); Xiang Li, Austin, TX (US)

(73) Assignee: QUALCOMM INCORPORATED, San Diego, CA (US)

( * ) Notice: Subject to any disclaimer, the term of this patent is extended or adjusted under 35 U.S.C. 154(b) by 0 days.

(21) Appl. No.: 16/906,501

(22) Filed: Jun. 19, 2020

(65) Prior Publication Data

US 2021/0399722 A1    Dec. 23, 2021

(51) Int. Cl.
*H03K 5/133* (2014.01)
*H03L 7/081* (2006.01)
*H03K 5/00* (2006.01)

(52) U.S. Cl.
CPC ............ *H03K 5/133* (2013.01); *H03L 7/081* (2013.01); *H03K 2005/00019* (2013.01)

(58) Field of Classification Search
None
See application file for complete search history.

(56) References Cited

U.S. PATENT DOCUMENTS

| | | | | |
|---|---|---|---|---|
| 6,879,200 B2* | 4/2005 | Komura | ................. | H03K 5/133 327/272 |
| 6,992,516 B2* | 1/2006 | Yeh | ....................... | H03K 5/1565 327/175 |
| 7,382,170 B2* | 6/2008 | Pollock | .................. | H03K 5/133 327/261 |
| 7,456,671 B2* | 11/2008 | Hwang | .................. | H03H 11/26 327/272 |
| 7,490,273 B2* | 2/2009 | Chen | ...................... | H03K 5/131 327/158 |
| 7,495,429 B2* | 2/2009 | Tessarolo | ......... | G01R 31/31725 324/76.35 |
| 8,680,907 B2* | 3/2014 | Chlipala | ................ | H03K 5/133 327/261 |
| 9,413,344 B2* | 8/2016 | Bowman | .................... | G06F 1/10 |
| 10,587,250 B2* | 3/2020 | Hanke | ...................... | G06F 1/324 |
| 10,587,253 B1* | 3/2020 | Huang | .................... | G06F 1/305 |

* cited by examiner

*Primary Examiner* — Jeffery S Zweizig
(74) *Attorney, Agent, or Firm* — Chui-kiu Teresa Wong

(57) ABSTRACT

Aspects of the disclosure are directed to adaptively delaying an input signal. In accordance with one aspect, an apparatus includes a plurality of delay units, wherein each of the plurality of delay units includes a substantially similar output load characteristic; a plurality of buffer units, wherein each of the plurality of buffer units is coupled to one of the plurality of delay units; wherein a quantity of the plurality of delay units equals a quantity of the plurality of buffer units; an additional delay unit coupled to a delay unit output of one of the plurality of delay units; and a one-hot decoder coupled to each of the plurality of buffer units, the one-hot decoder configured to enable one and only one of the plurality of buffer units.

13 Claims, 8 Drawing Sheets

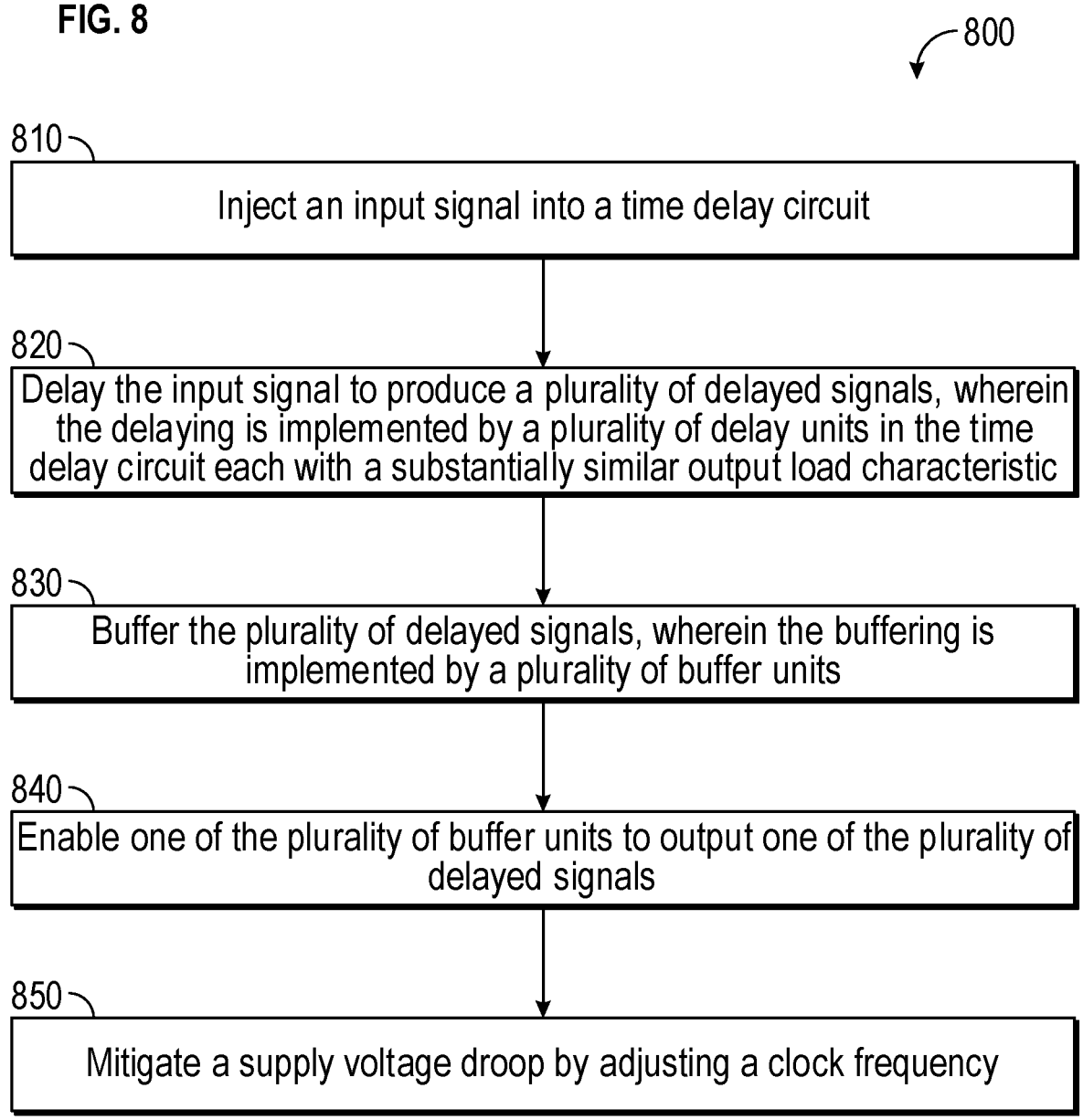

SYMMETRICALLY-INTERCONNECTED TUNABLE TIME DELAY CIRCUIT

TECHNICAL FIELD

This disclosure relates generally to the field of time delay circuits, and, in particular, to a symmetrically-interconnected tunable time delay circuit.

BACKGROUND

An electronic system which includes one or more system constituents may be used for a variety of functions (e.g., control, communication, computing, networking, signal processing, energy transfer, monitoring, etc.). A time delay circuit with one or more time delay units widely used in many electronic systems to introduce a time delay in a signal at a system constituent based on a delay setting. However, due to variations in the time delay units, an actual time delay increment for each delay setting will be different from other time delay increments. That is, over a range of delay settings, the actual time delays may be nonlinear over all delay settings.

SUMMARY

The following presents a simplified summary of one or more aspects of the present disclosure, in order to provide a basic understanding of such aspects. This summary is not an extensive overview of all contemplated features of the disclosure, and is intended neither to identify key or critical elements of all aspects of the disclosure nor to delineate the scope of any or all aspects of the disclosure. Its sole purpose is to present some concepts of one or more aspects of the disclosure in a simplified form as a prelude to the more detailed description that is presented later.

In one aspect, the disclosure provides a symmetrically-interconnected tunable time delay circuit. Accordingly, an apparatus including: a plurality of delay units, wherein each of the plurality of delay units includes a substantially similar output load characteristic; a plurality of buffer units, wherein each of the plurality of buffer units is coupled to one of the plurality of delay units; wherein a quantity of the plurality of delay units equals a quantity of the plurality of buffer units; an additional delay unit coupled to a delay unit output of one of the plurality of delay units; and a one-hot decoder coupled to each of the plurality of buffer units, the one-hot decoder configured to enable one and only one of the plurality of buffer units. In one example, the apparatus further includes an adaptive clock distribution circuit coupled to the single metal line.

In one example, each of the plurality of buffer units comprises a buffer unit input and each of the plurality of delay units comprises a delay unit output. In one example, the buffer unit input of each of the plurality of buffer units is coupled to the delay unit output of a corresponding delay unit from the plurality of delay units. In one example, each of the plurality of delay units includes a time delay increment, wherein the time delay increment of each of the plurality of delay units is substantially similar. In one example, each of the plurality of buffer units drives a substantially similar interconnect to a single metal line.

In one example, the quantity of the plurality of buffer units does not exceed $2^N$ and wherein the one-hot decoder decodes a command word with N bits to enable one and only one of the plurality of buffer units, where N is an integer. In one example, each of the plurality of buffer units is a tri-state buffer unit. In one example, the substantially similar output load characteristic comprises a passive load and an active load. In one example, the substantially similar output load characteristic includes a physical layer property. In one example, the physical layer property includes a substantially similar metal link, a substantially similar metal layer, or a substantially similar metal dimension.

Another aspect of the disclosure provides a method for adaptively delaying an input signal including: delaying the input signal to produce a plurality of delayed signals, wherein the delaying is implemented by a plurality of delay units each with a substantially similar output load characteristic; buffering the plurality of delayed signals, wherein the buffering is implemented by a plurality of buffer units; and enabling one of the plurality of buffer units to output one of the plurality of delayed signals. In one example, the method further includes mitigating a supply voltage droop by adjusting a clock frequency.

In one example, each of the plurality of buffer units comprises a buffer unit input and each of the plurality of delay units comprises a delay unit output. In one example, the buffer unit input of each of the plurality of buffer units is coupled to the delay unit output of a corresponding delay unit from the plurality of delay units. In one example, each of the plurality of delay units includes a time delay increment, wherein the time delay increment of each of the plurality of delay units is substantially similar. In one example, each of the plurality of buffer units drives a substantially similar interconnect to a single metal line.

In one example, a quantity of the plurality of buffer units does not exceed $2^N$ and wherein a one-hot decoder decodes a command word with N bits to enable one and only one of the plurality of buffer units, where N is an integer. In one example, each of the plurality of buffer units is a tri-state buffer unit. In one example, the substantially similar output load characteristic comprises a passive load and an active load. In one example, the substantially similar output load characteristic includes a physical layer property. In one example, the physical layer property includes a substantially similar metal link, a substantially similar metal layer, or a substantially similar metal dimension.

Another aspect of the disclosure provides an apparatus including: a plurality of delay units, wherein each of the plurality of delay units includes a substantially similar output load characteristic; a plurality of buffer units, wherein each of the plurality of buffer units is coupled to one of the plurality of delay units; wherein each of the plurality of buffer units drives a substantially similar interconnect to a single metal line and wherein a quantity of the plurality of delay units equals a quantity of the plurality of buffer units; an additional delay unit coupled to a delay unit output of one of the plurality of delay units; a one-hot decoder coupled to each of the plurality of buffer units, the one-hot decoder configured to enable one and only one of the plurality of buffer units; and an adaptive clock distribution (ACD) circuit coupled to the single metal line. In one example, the apparatus further includes an electronic circuit coupled to the adaptive clock distribution (ACD) circuit.

In one example, the apparatus is part of one of the following: a programmable delay line, a time-based circuit, a phase-locked loop (PLL), or a delay-locked loop (DLL). In one example, the apparatus is a system on a chip (SoC). In one example, the adaptive clock distribution (ACD) circuit includes a dynamic variation monitor (DVM) configured to detect power supply voltage droop in the adaptive clock distribution (ACD) circuit.

Another aspect of the disclosure provides a non-transitory computer-readable medium storing computer executable code, operable on a device including at least one processor and at least one memory coupled to the at least one processor, wherein the at least one processor is configured to adaptively delaying an input signal, the computer executable code including: instructions for causing a computer to delay the input signal to produce a plurality of delayed signals, wherein the delaying is implemented by a plurality of delay units each with a substantially similar output load characteristic; instructions for causing the computer to buffer the plurality of delayed signals, wherein the buffering is implemented by a plurality of buffer units; and instructions for causing the computer to enable one of the plurality of buffer units to output one of the plurality of delayed signals.

In one example, the non-transitory computer-readable medium further includes instructions for causing the computer to mitigate a supply voltage droop by adjusting a clock frequency. In one example, the plurality of delay units includes a time delay increment and wherein the time delay increment of each of the plurality of delay units is substantially similar.

These and other aspects of the present disclosure will become more fully understood upon a review of the detailed description, which follows. Other aspects, features, and implementations of the present disclosure will become apparent to those of ordinary skill in the art, upon reviewing the following description of specific, exemplary implementations of the present invention in conjunction with the accompanying figures. While features of the present invention may be discussed relative to certain implementations and figures below, all implementations of the present invention can include one or more of the advantageous features discussed herein. In other words, while one or more implementations may be discussed as having certain advantageous features, one or more of such features may also be used in accordance with the various implementations of the invention discussed herein. In similar fashion, while exemplary implementations may be discussed below as device, system, or method implementations it should be understood that such exemplary implementations can be implemented in various devices, systems, and methods.

BRIEF DESCRIPTION OF THE DRAWINGS

FIG. 8 illustrates an example flow diagram for a introducing a quasi-linear time delay into an electronic system using a symmetrically-interconnected tunable time delay circuit.

DETAILED DESCRIPTION

Figure 1:
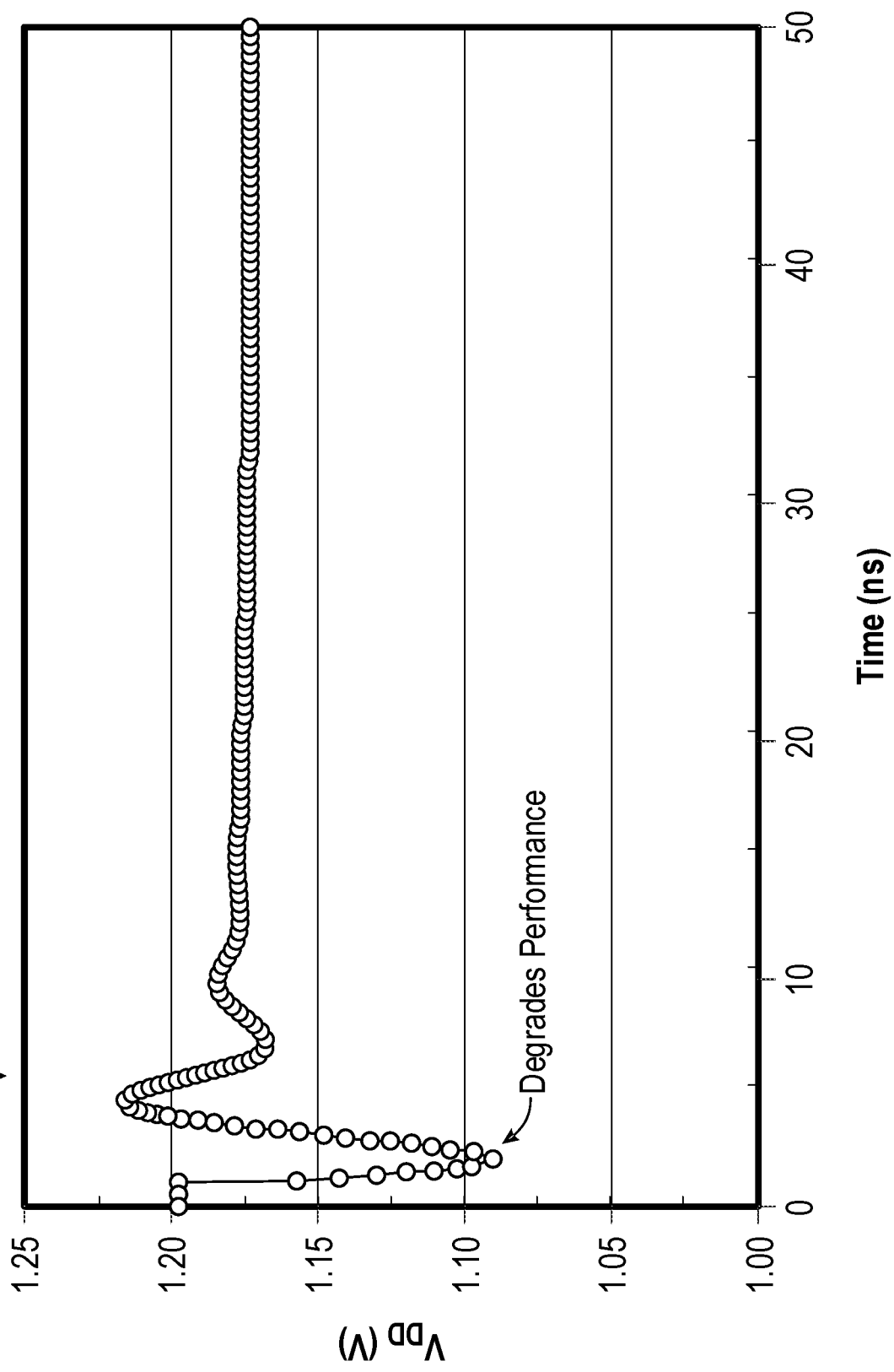
FIG. 1 illustrates an example graph of a power supply voltage droop characteristic.

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well known structures and components are shown in block diagram form in order to avoid obscuring such concepts.

While for purposes of simplicity of explanation, the methodologies are shown and described as a series of acts, it is to be understood and appreciated that the methodologies are not limited by the order of acts, as some acts may, in accordance with one or more aspects, occur in different orders and/or concurrently with other acts from that shown and described herein. For example, those skilled in the art will understand and appreciate that a methodology could alternatively be represented as a series of interrelated states or events, such as in a state diagram. Moreover, not all illustrated acts may be required to implement a methodology in accordance with one or more aspects.

In an electronic system which includes one or more system constituents, a time delay circuit may be used to introduce a time delay in a signal. In one example, the time delay is selected by a delay setting. For example, the delay setting may be a digital word with N bits which designates a nominal time delay. That is, with N bits, up to $2^N$ different delay settings may be selected. For example, if N=4 bits, up to $2^4$, that is, up to 16 different delay settings (and therefore 16 possible nominal time delays) are possible. In one example, the delay setting may be denoted by an integer n, where n ranges from n=0 to n=$2^N$-1. If N=4 bits, for example, then the delay setting, n, ranges from n=0 to n=15. For example, the nominal time delay represents a desired time delay which may be approximated by an actual time delay implemented by the time delay circuit.

In one example, there are a variety of design implementations in introducing a time delay. In general, the time delay is implemented by a superposition of a plurality of time delay units. Ideally, the plurality of time delay units may have time delay increments which are integrally related over all possible desired time delays. For example, the plurality of time delay units may have time delay increments which are different, but are integrally related. For example, a 1× time delay unit introduces a nominal time delay of one time delay increment, a 2× time delay unit introduces a nominal time delay of two time delay increments, a 4× time delay unit introduces a nominal time delay of four time delay increments, etc.

In one example, in an ideal scenario, an ideal time delay $T_i(n)$ for an nth delay setting may be expressed as $T_i(n)=n\tau$, where n represents the delay setting as an integer and $\tau$ is an ideal delay increment. That is, in the ideal scenario, the ideal time delays may be:

$$T_i(0)=0, T_i(1)=\tau, T_i(2)=2\tau, \ldots T_i(N-1)=(N-1)\tau.$$

In other words, in the ideal scenario, the ideal time delays $T_i(n)$ are integral multiples of the ideal delay increment $\tau$. In one example, the ideal time delays $T_i(n)$ may be described as linear over the range of all delay settings. For example, linear time delays follow:

$$T_i(n)=n\tau \text{ for } n=0,1,2,\ldots,N-1.$$

In one example, in an actual scenario, an actual time delay $T_a(n)$ for an nth delay setting may be expressed as:

$$T_a(0)=0, T_a(1)=\Delta t_1, T_a(2)=\Delta t_2, \ldots T_a(N-1)=\Delta t_{N-1}.$$

In this example, the actual time delays $T_a(n)$ are not integral multiples of the ideal delay increment $\tau$. In one example, the actual time delays $T_a(n)$ may be described as nonlinear over the range of all delay settings.

For example, if the actual time delays $T_a(n)$ are not integral multiples of the ideal delay increment $\tau$ but are integral multiples of the ideal delay increment $\tau$ within a delay tolerance $\pm\delta$ over the range of all delay settings, the actual time delays $T_a(n)$ may be described as quasi-linear time delays $T_q(n)$ over the range of all delay settings. For example, the delay setting may be represented by an integer n. For example, a quasi-linear time delay difference between adjacent time delays should be substantially similar for all desired time delays. For example, quasi-linear time $T_q(n)$ delays follow the mathematical delay tolerance criterion:

$$n\tau-\delta \leq T_q(n) \leq n\tau+\delta \text{ for } n=0,1,2,\ldots,N-1.$$

For example, an absolute value of the delay tolerance $|\delta|$ may be no greater than a fraction $\varepsilon$ of the ideal delay increment $\tau$, where $\varepsilon<1$. That is, $|\delta|\leq\varepsilon\tau$. For example, the fraction $\varepsilon$ may be 0.1 (i.e., 10%).

In one example, the quasi-linear time delays monotonically increase as the delay setting increases from a minimum delay setting to a maximum delay setting. In another example, the quasi-linear time delays monotonically increase as the delay setting decreases from a maximum delay setting to the minimum delay setting. For example, adjacent time delays are time delays with delay settings that differ by one when the delay settings are integers.

In one example, a signal in the electronic system may be used to convey information or state from a one system constituent to another system constituent. In one example, the signal may be a clock signal, used to regulate state transitions synchronously in a digital circuit within the electronic system. For example, an input clock signal may be sent to a clock time delay circuit to produce a delayed clock signal where the delayed clock signal is offset in time from the input clock signal. For example, the clock time delay circuit may introduce a first time delay in the delayed clock signal with respect to the input clock signal. In addition, a time delay calibration system with a reference time delay circuit may be used to calibrate the clock time delay circuit.

In one example, if an input signal is represented by the notation s(t), where t represents an independent variable (e.g. time) and s represents a dependent variable (e.g. amplitude), a time delay circuit may introduce a time delay $T_d$ to the input signal s(t) and produce a delayed signal $s(t-T_d)$. In one example, the time delay circuit may be a programmable or tunable time delay circuit where the time delay $T_d$ is selectable. For example, the tunable time delay circuit may be implemented as a superposition of time delay units to achieve an actual time delay $T_a(n)$, where n is an integer.

In one example, the time delay from the time delay circuit is programmable or tunable over a range of time delays $T_d$. That is, the time delay may be selected by command among a finite quantity of delay settings. For example, a first delay setting may select a first time delay, a second delay setting may select a second time delay, etc., and the last delay setting may select a last time delay. In one aspect, a time delay difference (i.e., time delay increment) between adjacent time delays should be substantially similar for all time delays. That is, the range of time delays from the time delay circuit should be linear or quasi-linear. In one example, the first delay setting may be a minimum delay setting. In one example, the last delay setting may be a maximum delay setting.

In one example, the range of time delays from the time delay circuit may be nonlinear. That is, in some examples, the time delay differences (i.e., time delay increments) between adjacent time delays may not be substantially similar for all time delays.

FIG. 1 illustrates an example graph 100 of a power supply voltage droop characteristic. The example graph 100 shows supply voltage $V_{DD}$ (in volts) vs. time (in ns) where abrupt changes in load circuit (e.g., processor) activity may induce large current transients in a power delivery network to a load circuit. For example, FIG. 1 shows a voltage droop of greater than 0.1 volt over a few nanoseconds. In one example, infrequent voltage droops in the power supply may degrade load circuit performance and reduce energy efficiency.

One technique to mitigate power supply voltage droop is to reduce a clock frequency in the load circuit. However, a slower clock frequency directly translates to a slower load speed. Another technique to mitigate power supply voltage droop is to increase supply voltage level. However, an increased supply voltage level degrades energy efficiency. Hence, an alternate power supply voltage droop mitigation is disclosed herein.

Figure 2:
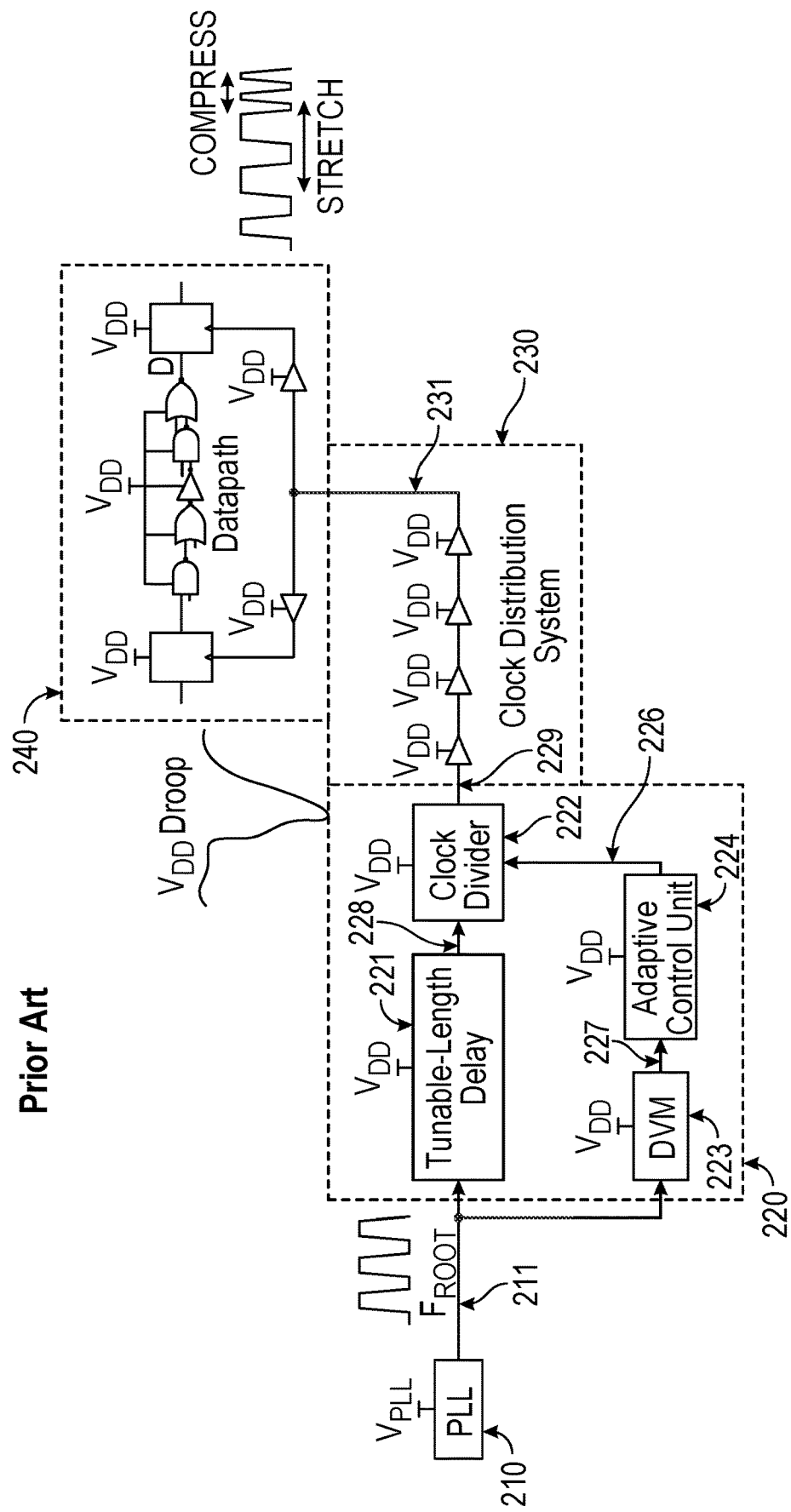
FIG. 2 illustrates an example of an adaptive clock distribution (ACD) system.

FIG. 2 illustrates an example of an adaptive clock distribution (ACD) system 200. In one example, the ACD system is designed to change a clock frequency to mitigate power supply voltage droop. A phase locked loop (PLL) 210 may be used as to generate an input clock signal 211. In one example, the input clock signal 211 is a square wave signal with root clock frequency $f_{ROOT}$. For example, the PLL 210 may be supplied by a PLL power supply with first power supply voltage $V_{PLL}$.

An adaptive clock distribution (ACD) circuit 220 accepts the input clock signal 211 and produces an output clock signal 229. In one example, the output clock signal 229 is a square wave signal with an output clock frequency. In one example, the output clock frequency is less than or equal to the root clock frequency $f_{ROOT}$. In one example, the ACD circuit 220 includes a tunable time delay 221 (e.g., a tunable-length delay), a clock divider 222, a dynamic variation monitor (DVM) 223 and an adaptive control unit (ACU) 224. For example, the ACD circuit 220 may be supplied by an ACD power supply with a second power supply voltage. In one example, the second power supply voltage equals a common power supply voltage $V_{DD}$.

In one example, the tunable time delay 221 delays the input clock signal 211 by a tunable amount to produce a delayed clock signal 228. For example, the delayed clock signal permits the DVM 223 to respond properly. In one example, the tunable time delay sets a response time of the ACD circuit 220. For example, the clock divider 222 produces the output clock signal 229 from the delayed clock signal 228. For example, the DVM 223 accepts the input clock signal 211 and detects an onset of a voltage droop. For example, the DVM 223 produces a voltage droop indication signal 227. In one example, the DVM 223 detects the onset of the voltage droop on the second power supply voltage. In one example, the DVM 223 detects the onset of the voltage droop on the common power supply voltage $V_{DD}$.

In one example, the adaptive control unit 224 accepts the voltage droop indication signal 227 from the DVM 223 and sends a frequency control signal 226 to the clock divider 222. In one example, the frequency control signal 226 may indicate to the clock divider 222 to set the output clock frequency of the output clock signal 229 to the root clock frequency $f_{ROOT}$ or to a divided clock frequency. In one example, the divided clock frequency is half the root clock frequency $f_{ROOT}$.

In one example, the output clock signal 229 is sent to a clock distribution system 230. For example, the clock distribution system 230 buffers the output clock signal 229 and produces a buffered clock signal 231. In one example, the clock distribution system 230 may be supplied by a buffer power supply with third power supply voltage. In one example, the third power supply voltage is the same as the second power supply voltage. In one example, the third power supply voltage equals the common power supply voltage $V_{DD}$.

In one example, a load circuit 240 accepts the buffered clock signal 231 and distributes it to various circuitry in the load circuit 240 which requires a clock signal. For example, the circuitry may be part of a datapath in the load circuit 240. In one example, the load circuit 240 may be supplied by a load power supply with fourth power supply voltage. In one example, the fourth power supply voltage is the same as the second power supply voltage and/or the third power supply voltage. In one example, the fourth power supply voltage equals the common power supply voltage $V_{DD}$.

Figure 3:
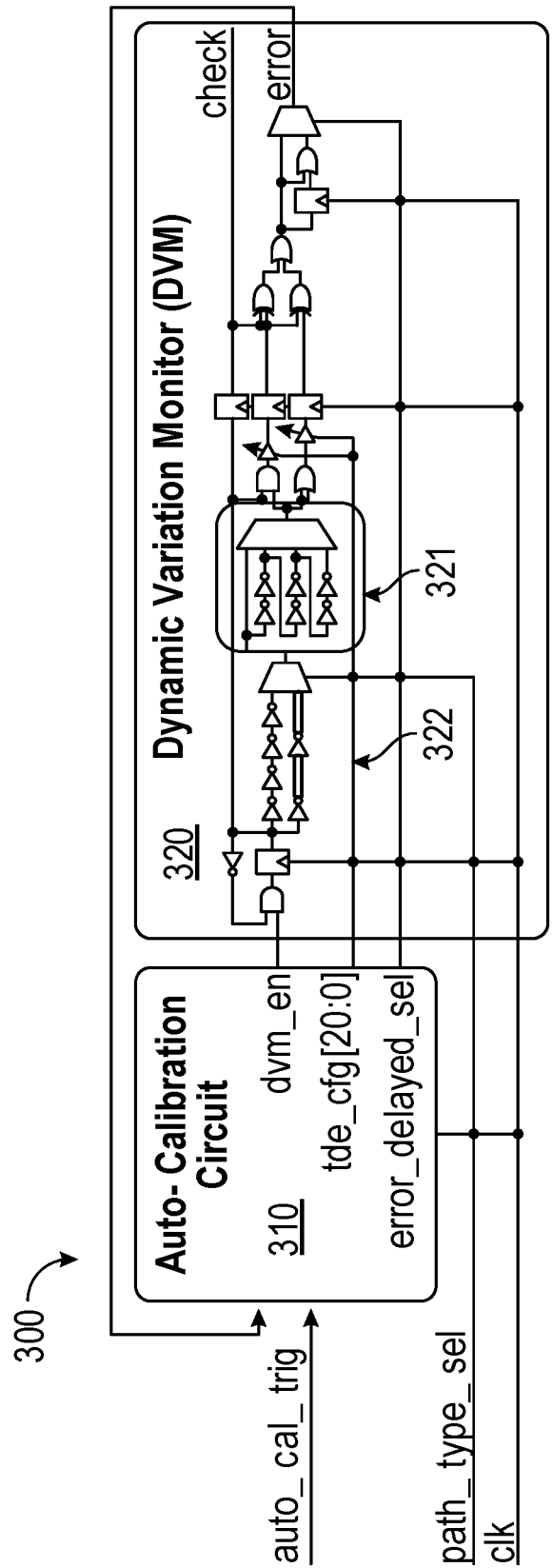
FIG. 3 illustrates an example dynamic variation monitor (DVM) auto-calibration system.

FIG. 3 illustrates an example dynamic variation monitor (DVM) auto-calibration system 300. In one example, the DVM auto-calibration system 300 includes an auto-calibration circuit 310 and a dynamic variation monitor (DVM) 320. In one example, the auto-calibration circuit 310 configures the DVM 320 to maximize ACD performance by selecting an appropriate dynamic variation monitor (DVM) timing margin. In one example, timing margin is an amount of excess time relative to a minimum required time for proper circuit functioning.

In one example, the DVM 320 includes one or more tunable time delay paths 321 to set a tunable time delay. In one example, the configuration of the tunable time delay paths 321 is set by a programmable delay path input 322 with one or more configuration bits. In one example, the DVM 320 includes one or more driving flip flops at the input and/or one or more receive flip flops at the output of the one or more tunable time delay paths 321.

In one example, the auto-calibration system 300 executes calibration steps to configure the DVM 320 to maximize ACD system performance as follows:
1. Place a load circuit (e.g., processor) in a safe mode for a target common power supply voltage and a target clock frequency.
2. Calibrate the programmable delay path input 322 to achieve a dynamic variation monitor (DVM) path timing margin near zero (e.g., near 0 ps).
3. Remove a programmable number of delay units (i.e., adjust calibration settings in the programmable delay path input 322) to reduce a dynamic variation monitor (DVM) path delay, which results in a positive dynamic variation monitor (DVM) path timing margin to avoid responding to frequent small voltage droops.

In one example, the dynamic variation monitor (DVM) path timing margin equals a clock period minus a dynamic variation monitor (DVM) path delay.

In one example, the calibration steps of the auto-calibration system 300 require a DVM 320 to have tunable time delay paths 321 with linear or quasi-linear time delay versus calibration settings.

Figure 4:
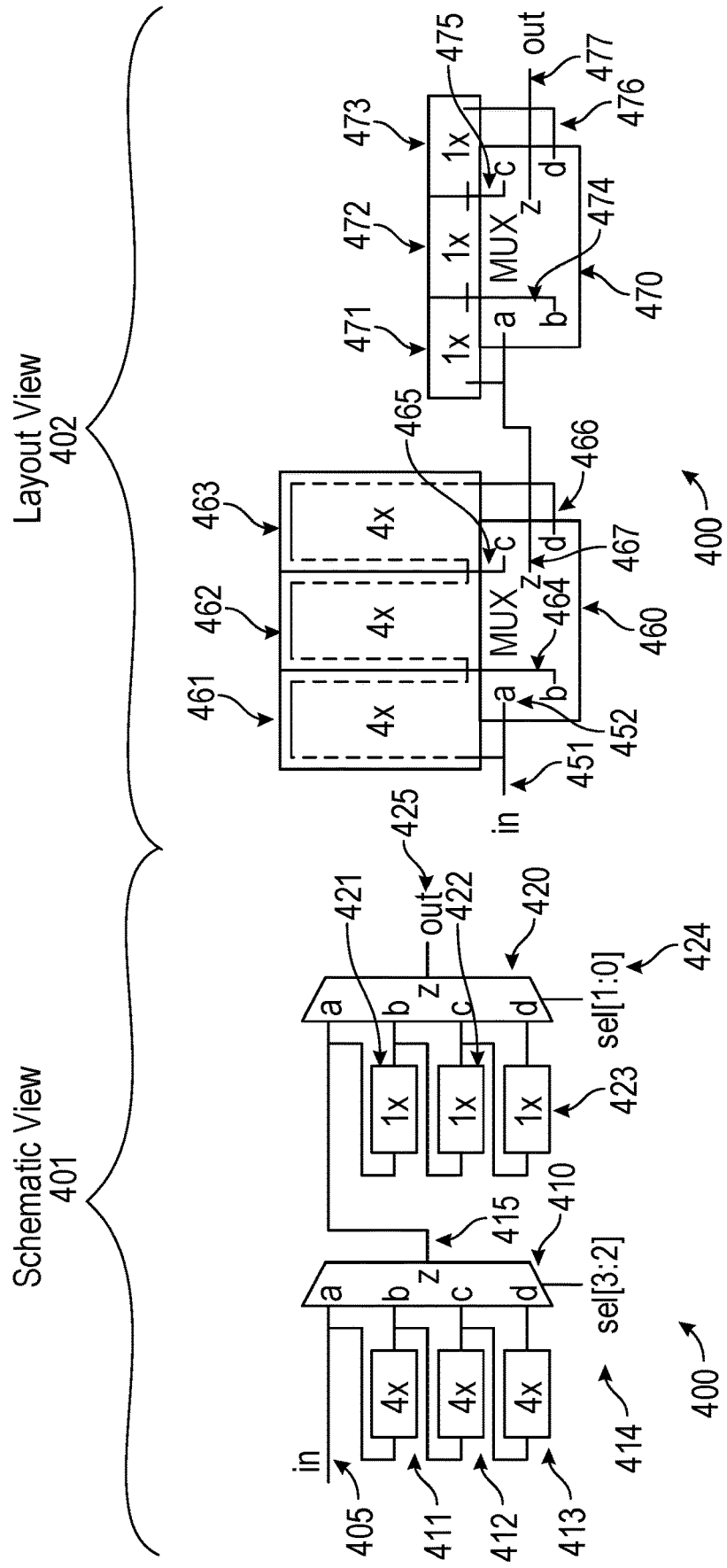
FIG. 4 illustrates a first example of a dynamic variation monitor (DVM) time delay circuit.

FIG. 4 illustrates a first example of a dynamic variation monitor (DVM) time delay circuit 400. FIG. 4 shows a schematic view 401 of the DVM time delay circuit 400 and a layout view 402 of the DVM time delay circuit 400. In FIG. 4's schematic view 401, an input signal 405 is sent to a first input terminal of a first multiplexer 410 and to an input of a first 4× delay unit 411. An output of the first 4× delay unit 411 is sent to a second input terminal of the first multiplexer 410 and to an input of a second 4× delay unit 412. An output of the second 4× delay unit 412 is sent to a third input terminal of the first multiplexer 410 and to an input of a third 4× delay unit 413. An output of the third 4× delay unit 413 is sent to a fourth input terminal of the first multiplexer 410.

In one example, a first output 415 of the first multiplexer 410 is connected to the first input terminal, second input terminal, third input terminal or fourth input terminal of the first multiplexer 410. For example, the connection is selected by a first selection word 414 (e.g., sel[3:2]). In the schematic view 401 shown in FIG. 4, the first selection word 414 has two bits and may select up to $2^2=4$ input terminals of the first multiplexer 410.

In one example, the first output 415 of the first multiplexer 410 is sent to a first input terminal of a second multiplexer 420 and to an input of a first 1× delay unit 421. An output of the first 1× delay unit 421 is sent to a second input terminal of the second multiplexer 420 and to an input of a second 1× delay unit 422. An output of the second 1× delay unit 422 is sent to a third input terminal of the second multiplexer 420 and to an input of a third 1× delay unit 423. An output of the third 1× delay unit 423 is sent to a fourth input terminal of the second multiplexer 420.

In one example, a second output 425 of the second multiplexer 420 is connected to the first input terminal, second input terminal, third input terminal or fourth input terminal of the second multiplexer 420. For example, the connection is selected by a second selection word 424 (e.g., sel[1:0]). In the example shown in the schematic view 401 of FIG. 4, the second selection word 424 has two bits and may select up to $2^2=4$ input terminals of the second multiplexer 420.

In one example, the DVM time delay circuit 400 may introduce a programmable delay into the input signal 405 to produce a delayed signal. In one example, the delayed signal is the same as the second output 425. For example, the first selection word 414 and the second selection word 424 may select a desired time delay by selection of the connections for the first multiplexer 410 and the second multiplexer 420, respectively.

In FIG. 4, the layout view 402 of the DVM time delay circuit 400 shows an input terminal 451 connected to a first multiplexer 460 using an input via 452. In one example, the first multiplexer 460 is connected to a first 4× delay unit 461, a second 4× delay unit 462 and a third 4× delay unit 463 with a first via 464, a second via 465 and a third via 466. In one example, the first multiplexer 460 also has a first output via 467 connected to a second multiplexer 470. In one example, the second multiplexer 470 is connected to a first 1× delay unit 471, a second 1× delay unit 472 and a third 1× delay unit 473 with a fourth via 474, a fifth via 475 and a sixth via 476. In one example, the second multiplexer 470 also has a second output via 477 which serves as a DVM time delay circuit output.

In one example, the layout view 402 of the DVM time delay circuit 400 shown in FIG. 4 illustrates some design challenges which may include one or more of the following:

metal connections from delay units to the multiplexer may vary significantly in physical dimensions;

the impact of different metal connections to the multiplexer input may degrade the linear time delay vs. the calibration settings;

a large layout effort may be needed to minimize the linear time delay error; and/or the multiplexers may induce a time delay mismatch between the rising and falling input transitions.

In one example, the DVM time delay circuit 400 is subject to at least two types of delay variation: design variation and process variation. In one example, design variation is referred to as pre-silicon variation such as intrinsic variations due to design tolerances independent of silicon implementation. In one example, process variation is referred to as post-silicon variation such as extrinsic variations due to process tolerances in the silicon implementation.

In one example, the design variation may be due to circuit and physical layout design differences. For example, the design variation may be due to the different interconnect resistance and capacitance values on nodes 452, 464, 465, and 466 or different interconnect resistance and capacitance values on nodes 467, 474, 475, and 476, resulting in non-linear time delays as the delay settings change with the multiplexer select bits 414 and 424. In one example, the process variation may result in transistor drive current variation. In one example, transistor drive current variation may be due to process variations in transistor channel length and threshold voltage. In one example, the process variation may be due to manufacturing process variations. In one example, the delay variation performance of the DVM time delay circuit 400 may be susceptible to process variation. For example, the tolerance of the delay variation may be greater than 25% (e.g., 26-27%).

Figure 5:
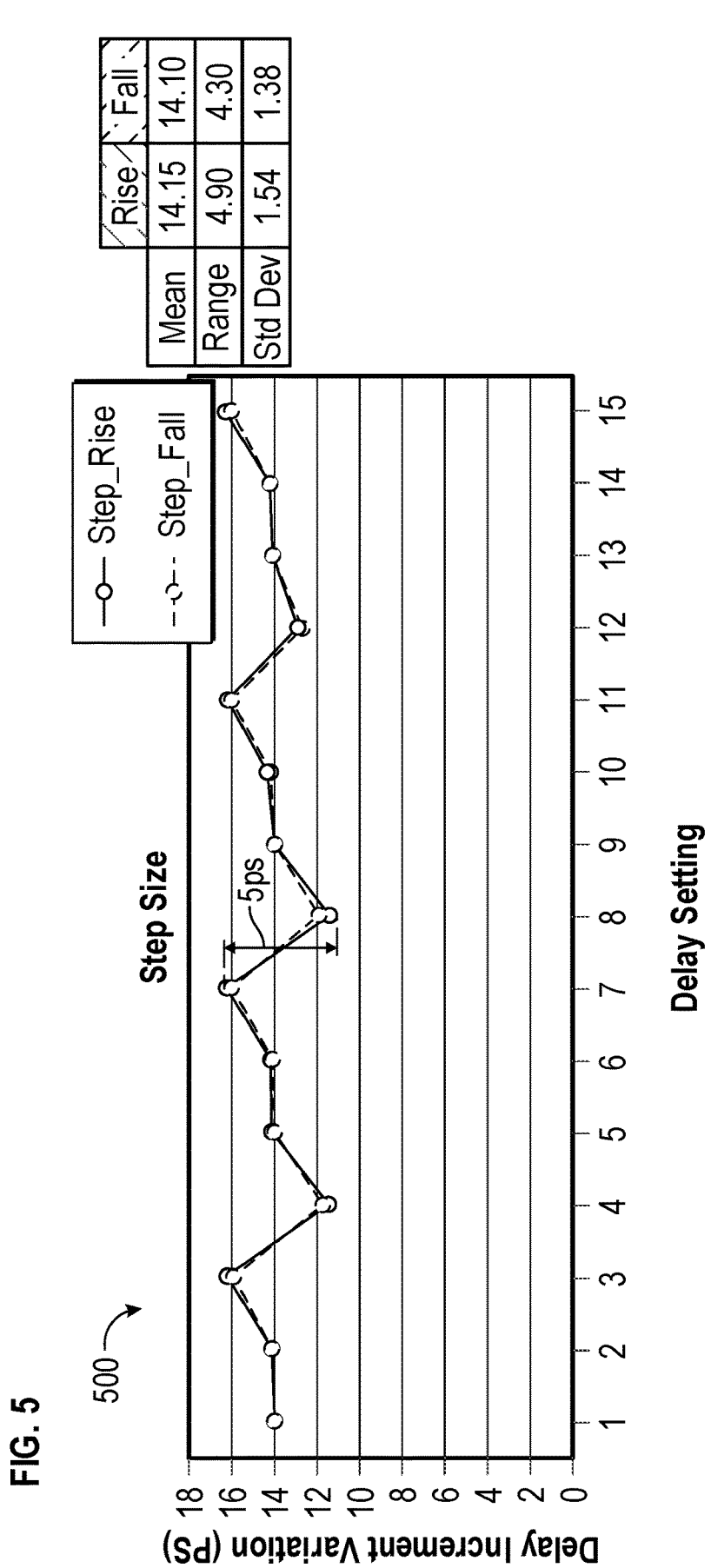
FIG. 5 illustrates an example of a computer simulation graph showing delay increment variation versus delay setting for the dynamic variation monitor (DVM) time delay circuit illustrated in FIG. 4.

FIG. 5 illustrates an example of a computer simulation graph 500 showing delay increment variation versus delay setting for the DVM time delay circuit 400 illustrated in FIG. 4. In the example shown in FIG. 5, a horizontal axis shows the delay setting as an integer ranging from 1 to 15 and a vertical axis shows the delay increment variation in picoseconds (ps) for both rising edge and falling edge. For example, FIG. 5 shows a worst-case delay increment variation of nearly 5 ps which is approximately 36% of the average delay increment of approximately 14 ps after a significant layout effort. In one example, this large delay increment variation requires a larger positive dynamic variation monitor (DVM) path timing margin which reduces ACD minimum voltage benefits.

Figure 6:
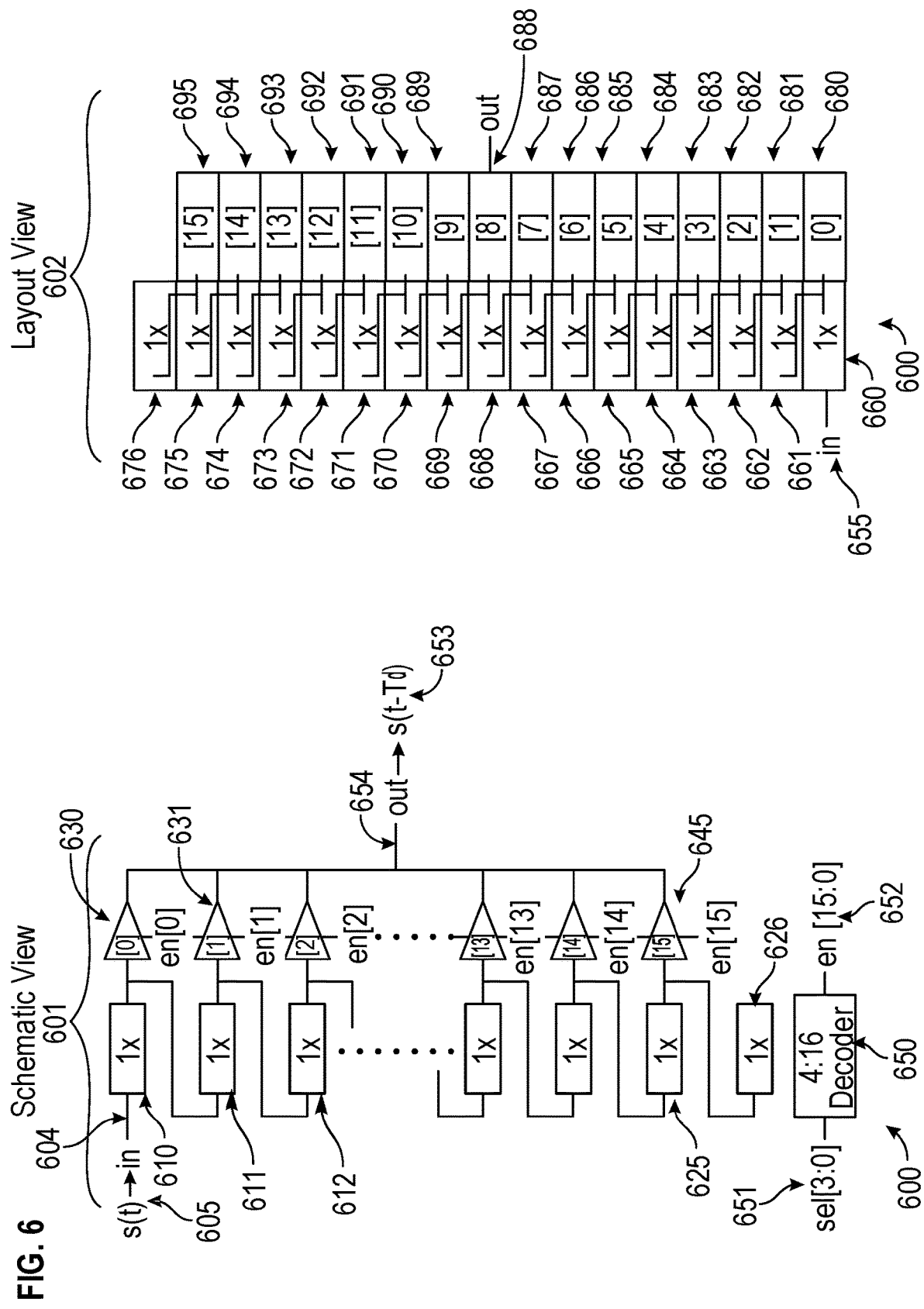
FIG. 6 illustrates a second example of a dynamic variation monitor (DVM) time delay circuit.

FIG. 6 illustrates a second example of a dynamic variation monitor (DVM) time delay circuit 600. FIG. 6 shows a schematic view 601 of the DVM time delay circuit 600 and a layout view 602 of the DVM time delay circuit 600. In one example, an input signal s(t) 605 is sent to an input 604 of a first delay unit 610. In one example, the input signal s(t) 605 may be a periodic signal with period T (i.e., s(t+T)=s(t)). In one example, the input signal s(t) 605 may be a calibration signal used to calibrate time delay. In another example, the input signal s(t) 605 may be a datapath signal, for example, for signal processing. An output of the first delay unit 610 may be sent to an input of a first buffer unit 630 and to an input of a second delay unit 611. An output of the second delay unit 611 may be sent to an input of a second buffer unit 631 and to an input of a third delay unit 612.

In one example, this structure continues whereby an output of an nth delay unit may be sent to an input of the nth buffer unit and to an input of an (n+1)th delay unit. In the example shown in FIG. 6, an output of a sixteenth delay unit 625 may be sent to an input of the sixteenth buffer unit 645 and to an input of a seventeenth delay unit 626. For example, the output of each delay unit is sent to an input of a buffer unit and an input of another delay unit. In one example, the delay units are interconnected as serially-connected symmetrically-interconnected delay units. In the example of FIG. 6, the DVM time delay circuit 600 includes 16 buffer units and 17 delay units. In one example, the quantity of delay units is always one more than the quantity of buffer units. One skilled in the art would understand that other quantities of buffer units and delay units (different than the quantities disclosed herein) are also within the scope of the present disclosure.

In one example, each of the delay units shown in FIG. 6 is a 1× delay unit. For example, a 1× delay unit is a delay unit with a time delay increment substantially equal to a fundamental delay increment $\tau_0$. In one example, each time delay increment is equal to the fundamental delay increment $\tau_0$ within a delay tolerance $\delta$ over the range of all delay settings. One skilled in the art would understand that other delay units (such as Nx delay units, wherein N is any integer) are also within the scope of the present disclosure.

In one example, each delay unit drives a buffer unit and a subsequent delay unit. In one example, the buffer units drive a substantially similar interconnection to a common transmission line.

In one example, the DVM time delay circuit 600 may introduce a programmable time delay $T_d$ into the input signal 605 to produce a delayed signal $s(t-T_d)$ 653 at an output 654 using a decoder 650. In one example, a delay configuration word 651 (i.e., delay setting) sent to the decoder 650 may select a desired time delay by setting an enable word 652. For example, the delay configuration word 651 may have one or more configuration bits. In one example, the decoder 650 is a one-hot decoder. For example, the one-hot decoder asserts (i.e., sets to a high logic level) one and only one enable bit in the enable word 652. In one example, the decoder 650 decodes the delay configuration word 651 by asserting one and only one enable bit in the enable word 652.

In one example, each buffer unit is a tri-state buffer unit with a buffer input and a buffer output. For example, the tri-state buffer may have three states at the buffer output: low state, high state, high impedance state. For example, the low state is equivalent to a logic level of 0 and follows a low input level. For example, the high state is equivalent to a logic level of 1 and follows a high input level. For example, in the high impedance state, the buffer output is disconnected from the buffer input. For example, the high impedance state is applicable when a plurality of buffer units drives a substantially similar interconnection to a common transmission line. In one example, the common transmission line is a single metal line.

In one example, the delay configuration word 651 has N bits and informs the decoder 650 to assert one and only one asserted bit of up to $2^N$ enable bits in the enable word 652. For example, if N=4 bits, then the delay configuration word 651 may inform the decoder 650 to assert one and only one of up to $2^4$=16 enable bits in the enable word 652. One skilled in the art would understand that the quantity of bits (i.e., the value of N) may include other values and not just N=4 as illustrated by this example.

In one example, the decoder 650 is a one-hot decoder. For example, the one and only one asserted bit of up to $2^N$ enable bits configures one and only one buffer unit to either the low state or high state, depending on the input level. For example, the one and only one asserted bit configures one and only one buffer unit away from the high impedance state.

In one example, the actual time delays $T_a(n)$ are integral multiples of the ideal delay increment $\tau$ within a delay tolerance $\pm\delta$ over the range of all delay settings. The actual time delays $T_a(n)$ may be described as quasi-linear time delays $T_q(n)$ over the range of all delay settings. For example, a quasi-linear time delay difference (i.e., time delay increment) between adjacent time delays may be substantially similar for all desired time delays. For example, quasi-linear time delays $T_q(n)$ may follow a mathematical delay tolerance criterion:

$n\tau-\delta \leq T_q(n) \leq n\tau+\delta$ for $n=0,1,2,\ldots,N-1$, where $\delta$ is delay tolerance.

In FIG. 6, the layout view 602 of the DVM time delay circuit 600 shows a cascade of delay units 660 through 676 following an input 655. In one example, a layout of each of the delay units has substantially similar geometry and interconnections. In one example, buffer units 680 through 695 are laid adjacent to the delay units. In one example, a layout of each of the buffer units has substantially similar geometry and interconnections.

In one example, a quantity of delay units is one more than a quantity of buffer units. For example, a first delay unit 660 is adjacent to a first buffer unit 680, a second delay unit 661 is adjacent to a second buffer unit 681, etc. A final delay unit 676 is not adjacent to a buffer unit. For example, the final delay unit 676 serves as a proper termination for an output of a previous delay unit. In the example shown in FIG. 6, the previous delay unit is delay unit 675.

In one example, outputs of each buffer unit 680-695 drive a substantially similar interconnection to a common transmission line. In one example, substantially similar interconnection to a common transmission line is quantified by load impedance tolerance. In one example, the load impedance tolerance may be ±3% over a range of delay settings. In one example, the common transmission line is a single metal line. In one example, the buffer unit is a tri-state buffer unit. In one example, the substantially similar interconnection implements a quasi-linear time delay $T_q(n)$.

In one example, the substantially similar interconnection has substantially similar dimensions and substantially similar thermal coefficients. In one example, the substantially similar interconnection has substantially similar transmission line delay due to substantially similar distributed inductance L (in henry/m) and distributed capacitance C (in farad/m). For example, transmission line delay is proportional to a product of distributed inductance L and distributed capacitance C. In another example, the substantially similar interconnection has substantially similar group delay due to a resistor-capacitor time constant $\tau_{RC}$. In one example, the time constant $\tau_{RC}$ is a product of net resistance $R_0$ and net capacitance $C_0$.

In one example, the DVM time delay circuit 600 is subject to no design variation (or minimal design variation) but only process variation. In one example, design variation is referred to as pre-silicon variation such as intrinsic variations due to design tolerances independent of silicon implementation. In one example, process variation is referred to as post-silicon variation such as extrinsic variations due to process tolerances in the silicon implementation.

In one example, process variation may be due to manufacturing process variation. In one example, the process variation in the DVM time delay circuit 600 is less than the process variation in the DVM time delay circuit 400 (shown in FIG. 4) since interconnects or metal links in the DVM time delay circuit 600 have same dimensions. In one example, the DVM time delay circuit 600 includes metal layers with substantially similar length and includes same quantity of metal vias. In one aspect, substantially similar physical characteristics disclosed herein are also substantially identical physical characteristics.

In one example, delay matching between rising input transitions and falling input transitions is improved in the DVM time delay circuit 600 (shown in FIG. 6) over that of the DVM time delay circuit 400 (shown in FIG. 4). In one example, delay matching in the DVM time delay circuit 600 is improved over that of the DVM time delay circuit 400 due to the elimination of design variation and the minimization of process variation. For example, the minimization of process variation is due to interconnects or metal links in the DVM time delay circuit 600 having substantially similar dimensions.

In one example, the DVM time delay circuit 600 may be applied to any system which requires a precise variable time delay with a linear or quasi-linear step size. For example, the DVM time delay circuit 600 may be used for programmable delay lines, time-based circuits, phase-locked loops (PLLs), delay-locked loops (DLLs), etc. One skilled in the art would understand that the uses of the DVM time delay circuit 600 disclosed herein are only examples, and does not exclude other uses of the DVM time delay circuit 600 not mentioned herein.

In one example, the DVM time delay circuit 600 may be applied as part of a dynamic variation monitor (DVM) used to detect power supply voltage droop in an adaptive clock distribution (ACD) circuit. For example, the dynamic variation monitor (DVM) may include a tunable time delay with a time delay based on critical-path delay timings in a load circuit. In one example, the DVM time delay circuit 600 supports calibration of the ACD circuit using linear or quasi-linear time delay performance. In one example, the DVM time delay circuit 600 facilitates higher minimum voltage benefits in an ACD system.

Figure 7:
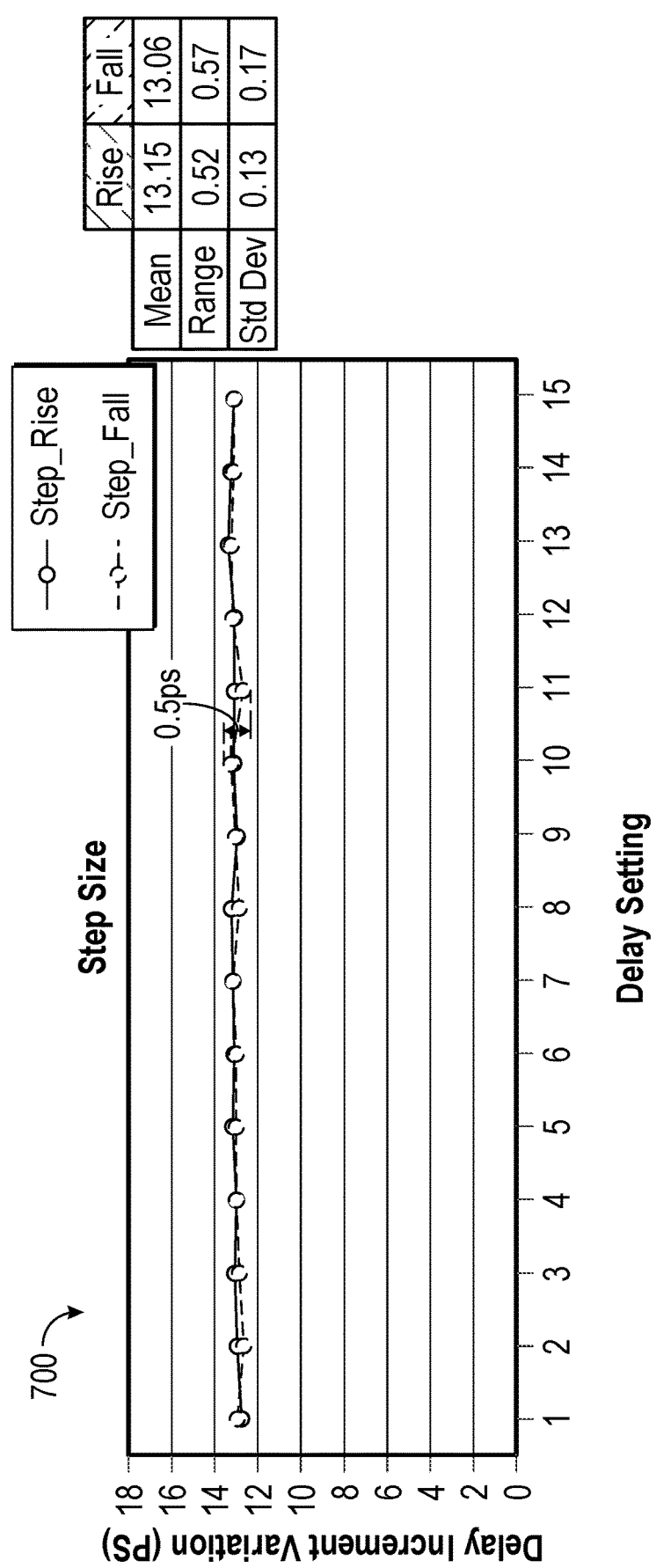
FIG. 7 illustrates an example of a computer simulation graph of delay increment variation versus delay setting for the dynamic variation monitor (DVM) time delay circuit of FIG. 6.

FIG. 7 illustrates an example of a computer simulation graph 700 of delay increment variation versus delay setting for the DVM time delay circuit 600 of FIG. 6. FIG. 7 shows a horizontal axis with a delay setting as an integer ranging from 1 to 15 and a vertical axis with a delay increment variation in picoseconds (ps) for both rising edge and falling edge. For example, FIG. 7's computer simulation graph 700 shows a worst-case delay increment variation of 0.5 ps which is approximately a factor of ten lower than computer simulation graph 500 shown in FIG. 5 which characterizes the DVM time delay circuit 400 shown in FIG. 4. In one example, the delay standard deviation is reduced from 1.5 ps to 0.17 ps when comparing performance of the DVM time delay circuit 400 (shown in FIG. 4) with the performance of the DVM time delay circuit 600 (shown in FIG. 6).

In one example, the improved delay variation performance of the DVM time delay circuit 600 significantly lowers delay increment variation to allow a smaller positive dynamic variation monitor (DVM) path timing margin which results in higher ACD minimum voltage improvement. In one example, the tolerance of the delay variation may be ±6.7% over a range of delay settings. In one example, the transistor drive current variation sensitivity is a significant determinant of delay variation. In one example, the substantially similar interconnection with substantially similar dimensions and substantially similar thermal coefficients results in a lower transistor drive current variation sensitivity which results in a lower delay variation.

FIG. 8 illustrates an example flow diagram 800 for introducing a quasi-linear time delay into an electronic system using a symmetrically-interconnected tunable time delay circuit. In one aspect, the example flow diagram illustrates adaptively delaying an input signal.

In block 810, an input signal (i.e., s(t)) is injected into a time delay circuit. In one example, the input signal is a periodic signal. In one example, the input signal is a clock signal or a datapath signal. In one example, the input signal is a calibration signal. In one example, the calibration signal may be used to calibrate a time delay. In one example, the calibration signal may be used to calibrate a dynamic variation monitor (DVM) to detect power supply voltage droops.

In block 820, the input signal is delayed to produce a plurality of delayed signals, wherein the delaying is implemented by a plurality of delay units in the time delay circuit each with a substantially similar output load characteristic. In one example, the delaying is implemented using the plurality of delay units each with a time delay increment substantially equal to a fundamental delay increment $\tau_0$. In one example, the plurality of delay units is a plurality of serially-connected symmetrically-interconnected delay units. In one example, the serially-connected symmetrically-interconnected delay units implement a quasi-linear time delay. For example, the time delay increment is equal to the fundamental delay increment $\tau_0$ within a delay tolerance $\delta$ over a range of all delay settings. In one example, the delay units maintain output symmetry with substantially similar physical layout and substantially similar load characteristic.

In one example, the substantially similar output load characteristic includes a passive load and an active load. In one example, the substantially similar output load characteristic includes a physical layer property. In one example, the physical layer property includes a substantially similar metal link, a substantially similar metal layer, or a substantially similar metal dimension. In one example, the substantially similar output load characteristic includes a buffer unit, another delay unit and substantially similar metal dimensions. In one example, each delay unit includes a delay unit output. In one example, each of the delay units includes a time delay increment, wherein the time delay increment of each of the delay units is substantially similar.

In block 830, the plurality of delayed signals are buffered, wherein the buffering is implemented by a plurality of buffer units. In one example, the buffering is based on a selected quasi-linear time delay in the time delay circuit. In one example, the plurality of buffer units each includes a substantially similar interconnection to a common transmission line. In one example, the common transmission line is a single metal line. In one example, the buffer unit is a tri-state buffer unit. In one example, the substantially similar interconnection implements the quasi-linear time delay. In one example, the substantially similar interconnection has substantially similar dimensions and substantially similar thermal coefficients. In one example, the substantially similar interconnection has substantially similar transmission line delay due to substantially similar distributed inductance L (in henry/m) and distributed capacitance C (in farad/m). For example, transmission line delay is proportional to a product of distributed inductance L and distributed capacitance C. In one example, the substantially similar interconnection has substantially similar group delay due to a resistor-capacitor time constant $\tau_{RC}$. For example, the time constant $\tau_{RC}$ is a product of net resistance $R_0$ and net capacitance $C_0$.

In one aspect, substantially similar physical characteristics disclosed in FIG. 8 are also substantially identical physical characteristics. In one example, each buffer unit includes a buffer unit input. In one example, the buffer unit input of each buffer units is coupled to the delay unit output of a corresponding delay unit. In one example, each of the buffer units drives a substantially similar interconnect to a single metal line.

In block 840, one of the plurality of buffer units is enabled to output one of the plurality of delayed signals. In one example, the enabling is implemented by selecting a quasi-linear time delay in the time delay circuit using a delay configuration word from the range of all delay settings. In one example, the delay configuration word is sent to a decoder. In one example, select the quasi-linear time delay $T_q(n)$ by setting an enable word. In one example, the decoder sets the enable word. In one example, the decoder may be a one-hot decoder. For example, the decoder asserts (i.e. sets to a high logic level) one and only one enable bit in the enable word. In one example, a quantity of the plurality of buffer units does not exceed $2^N$ and wherein the one-hot decoder decodes a command word with N bits to enable one and only one of the plurality of buffer units, where N is an integer. In block 850, a clock frequency is adjusted to mitigate a supply voltage droop.

In one aspect, one or more of the steps for adaptively delaying an input clock in FIG. 8 may be executed by one or more processors which may include hardware, software, firmware, etc. In one aspect, one or more of the steps in FIG. 8 may be executed by one or more processors which may include hardware, software, firmware, etc. The one or more processors, for example, may be used to execute software or firmware needed to perform the steps in the flow diagram of FIG. 8. Software shall be construed broadly to mean instructions, instruction sets, code, code segments, program code, programs, subprograms, software modules, applications, software applications, software packages, routines, subroutines, objects, executables, threads of execution, procedures, functions, etc., whether referred to as software, firmware, middleware, microcode, hardware description language, or otherwise.

The software may reside on a computer-readable medium. The computer-readable medium may be a non-transitory computer-readable medium. A non-transitory computer-readable medium includes, by way of example, a magnetic storage device (e.g., hard disk, floppy disk, magnetic strip), an optical disk (e.g., a compact disc (CD) or a digital versatile disc (DVD)), a smart card, a flash memory device (e.g., a card, a stick, or a key drive), a random access memory (RAM), a read only memory (ROM), a programmable ROM (PROM), an erasable PROM (EPROM), an electrically erasable PROM (EEPROM), a register, a removable disk, and any other suitable medium for storing software and/or instructions that may be accessed and read by a computer. The computer-readable medium may also include, by way of example, a carrier wave, a transmission line, and any other suitable medium for transmitting software and/or instructions that may be accessed and read by a computer. The computer-readable medium may reside in a processing system, external to the processing system, or distributed across multiple entities including the processing system. The computer-readable medium may be embodied in a computer program product. By way of example, a computer program product may include a computer-readable medium in packaging materials. The computer-readable medium may include software or firmware for adaptively delaying an input signal. Those skilled in the art will recognize how best to implement the described functionality presented throughout this disclosure depending on the particular application and the overall design constraints imposed on the overall system.

Any circuitry included in the processor(s) is merely provided as an example, and other means for carrying out the described functions may be included within various aspects of the present disclosure, including but not limited to the instructions stored in the computer-readable medium, or any other suitable apparatus or means described herein, and utilizing, for example, the processes and/or algorithms described herein in relation to the example flow diagram.

Within the present disclosure, the word "exemplary" is used to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling between two objects. For example, if object A physically touches object B, and object B touches object C, then objects A and C may still be considered coupled to one another—even if they do not directly physically touch each other. For instance, a first die may be coupled to a second die in a package even though the first die is never directly physically in contact with the second die. The terms "circuit" and "circuitry" are used broadly, and intended to include both hardware implementations of electrical devices and conductors that, when connected and configured, enable the performance of the functions described in the present disclosure, without limitation as to the type of electronic circuits, as well as software implementations of information and instructions that, when executed by a processor, enable the performance of the functions described in the present disclosure.

One or more of the components, steps, features and/or functions illustrated in the figures may be rearranged and/or combined into a single component, step, feature or function or embodied in several components, steps, or functions. Additional elements, components, steps, and/or functions may also be added without departing from novel features disclosed herein. The apparatus, devices, and/or components illustrated in the figures may be configured to perform one or more of the methods, features, or steps described herein. The novel algorithms described herein may also be efficiently implemented in software and/or embedded in hardware.

It is to be understood that the specific order or hierarchy of steps in the methods disclosed is an illustration of exemplary processes. Based upon design preferences, it is understood that the specific order or hierarchy of steps in the methods may be rearranged. The accompanying method claims present elements of the various steps in a sample order, and are not meant to be limited to the specific order or hierarchy presented unless specifically recited therein.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language of the claims, wherein reference to an element in the singular is not intended to mean "one and only one" unless specifically so stated, but rather "one or more." Unless specifically stated otherwise, the term "some" refers to one or more. A phrase referring to "at least one of" a list of items refers to any combination of those items, including single members. As an example, "at least one of: a, b, or c" is intended to cover: a; b; c; a and b; a and c; b and c; and a, b and c. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112, sixth paragraph, unless the element is expressly recited using the phrase "means for" or, in the case of a method claim, the element is recited using the phrase "step for."

What is claimed is:

1. An apparatus comprising:
  a time delay circuit including
    a plurality of delay units, wherein each of the plurality of delay units includes metal layers with substantially similar lengths and a same quantity of vias;
    a plurality of buffer units, wherein an input of each of the plurality of buffer units is coupled to one of the plurality of delay units; wherein a quantity of the plurality of delay units equals a quantity of the plurality of buffer units; and
  wherein an output of each of the plurality of buffer units is coupled to a substantially similar interconnect to drive a single metal line;
    an additional delay unit coupled to a delay unit output of one of the plurality of delay units; and
    a one-hot decoder coupled to each of the plurality of buffer units, the one-hot decoder configured to enable one and only one of the plurality of buffer units; and
  a receive flip flop coupled to the single metal line, wherein the time delay circuit is configured to provide a tunable delay path with quasi-linear time delay.

2. The apparatus of claim 1, wherein each of the plurality of buffer units comprises a buffer unit input and each of the plurality of delay units comprises a delay unit output.

3. The apparatus of claim 2, wherein the buffer unit input of each of the plurality of buffer units is coupled to the delay unit output of a corresponding delay unit from the plurality of delay units.

4. The apparatus of claim 1, wherein each of the plurality of delay units includes a time delay increment, wherein the time delay increment of each of the plurality of delay units is substantially similar.

5. The apparatus of claim 4, wherein the quantity of the plurality of buffer units does not exceed 2N and wherein the one-hot decoder decodes a command word with N bits to enable one and only one of the plurality of buffer units, where N is an integer.

6. The apparatus of claim 1, wherein each of the plurality of buffer units is a tri-state buffer unit.

7. A method for adaptively delaying an input signal comprising:
  delaying the input signal to produce a plurality of delayed signals, wherein the delaying is implemented by a plurality of delay units each with metal layers with substantially similar lengths and a same quantity of vias;
  buffering the plurality of delayed signals, wherein the buffering is implemented by a plurality of buffer units; and enabling one of the plurality of buffer units to output one of the plurality of delayed signals to a receive flip flop, wherein each of the plurality of buffer units drives a substantially similar interconnect to a single metal line coupled to the receive flip flop.

8. The method of claim 7, wherein each of the plurality of buffer units comprises a buffer unit input and each of the plurality of delay units comprises a delay unit output.

9. The method of claim 8, wherein the buffer unit input of each of the plurality of buffer units is coupled to the delay unit output of a corresponding delay unit from the plurality of delay units.

10. The method of claim 7, wherein each of the plurality of delay units includes a time delay increment, wherein the time delay increment of each of the plurality of delay units is substantially similar.

11. The method of claim 10, wherein a quantity of the plurality of buffer units does not exceed 2N and wherein a one-hot decoder decodes a command word with N bits to enable one and only one of the plurality of buffer units, where N is an integer.

12. The method of claim 7, further comprising adjusting a clock frequency to mitigate a supply voltage droop.

13. The method of claim 7, wherein each of the plurality of buffer units is a tri-stat buffer unit.

* * * * *